United States Patent [19]

Kondoh et al.

[11] Patent Number: 4,716,452
[45] Date of Patent: Dec. 29, 1987

[54] SEMICONDUCTOR INTEGRATED CIRCUIT DEVICE CONSTRUCTED BY POLYCELL TECHNIQUE

[75] Inventors: Hitoshi Kōndōh; Akihiro Sueda, both of Yokohama, Japan

[73] Assignee: Kabushiki Kaisha Toshiba, Kawasaki, Japan

[21] Appl. No.: 796,422

[22] Filed: Nov. 8, 1985

[30] Foreign Application Priority Data

Nov. 9, 1984 [JP] Japan ................. 59-235192

[51] Int. Cl.⁴ .................. H01L 23/48; H01L 27/10; H01L 27/02
[52] U.S. Cl. .................. 357/68; 357/45; 357/40; 357/59
[58] Field of Search .............. 357/68, 40, 45, 59 G

[56] References Cited

U.S. PATENT DOCUMENTS

| 3,921,282 | 11/1975 | Cummingham et al. | 357/41 |
| 4,161,662 | 7/1979 | Malcolm et al. | 357/40 |
| 4,249,193 | 2/1981 | Balyoz et al. | 357/40 |

FOREIGN PATENT DOCUMENTS

| 52-16189 | 2/1977 | Japan | 357/68 |
| 57-1253 | 1/1982 | Japan | 357/40 |
| 57-190343 | 11/1982 | Japan | 357/40 |
| 58-219747 | 12/1983 | Japan | 357/68 |
| 59-4138 | 1/1984 | Japan | 357/68 |
| 1433624 | 4/1976 | United Kingdom . | |

OTHER PUBLICATIONS

Patents Abstracts of Japan, vol. 2, No. 35, (E-77), Mar. 9, 1978, p. 12638 E 77, JP A 53 87, (Tokyo Shinaura), 5-1-78.

Shiotari et al., "New Taplas for Full Custom C2MOS LSI Design", IEEE CICC, pp. 111-114, 1982.

Primary Examiner—Martin H. Edlow
Assistant Examiner—Robert P. Limanek
Attorney, Agent, or Firm—Finnegan, Henderson, Farabow, Garrett & Dunner

[57] ABSTRACT

A semiconductor integrated circuit device has cell arrays each constituted by unit cells containing functional circuits. Polysilicon wiring layers or diffusion wiring layers are formed in the wiring regions provided among the arrays. A first metal wiring layer is formed by computer-aided design above each polysilicon wiring layer or each diffusion wiring layer. An insulating layer is then formed on the first metal wiring layer. A second metal wiring layer is formed by computer-aided design above the insulating layer. A via contact hole is cut in the insulating layer. A portion of the second metal wiring layer fills up the via contact hole, whereby the second metal wiring layer is connected to the first metal wiring layer. The via contact hole is formed above each polysilicon wiring layer or each diffusion wiring layer. It may have its axis intersecting with the axis of the polysilicon or diffusion wiring layer or not intersecting therewith. In the first case, the overlapping portions of the first and second metal wiring layer are made broader to facilitate the forming of the via contact hole. In the second case, the portion of each polysilicon or diffusion wiring layer which is positioned below the via contact hole is made broader than the other portions.

24 Claims, 17 Drawing Figures

SEMICONDUCTOR INTEGRATED CIRCUIT DEVICE CONSTRUCTED BY POLYCELL TECHNIQUE

BACKGROUND OF THE INVENTION

The present invention relates to a semiconductor integrated circuit (IC) device designed by using a computer and, more particularly, to a large-scale IC (LSI) made by the multi-layer aluminum wiring technique.

Computer-aided designing (CAD) of LSIs employs the so-called polycell technique disclosed in *IEEE Journal of Solid-State Circuits*, CH1726-9/82, pp. 111–114, 1982, and in Japanese Patent Application No. 51-74627 of the present applicants. High-speed operation and high integration of the semiconductor IC device made by the polycell technique are stated in U.S. patent application Ser. No. 709,107 filed Mar. 7, 1985. These references do not describe how to form a via contact hole to decrease errors and increase the packing density of the device when an aluminum layer extends through the hole and is connected to another aluminum layer.

The known polycell technique can be applied to produce two types of LSIs. The first type is made in the following manner. A first insulating layer is formed on a semiconductor substrate. A polysilicon wiring layer is formed on a selected portion of the first insulating layer. A second insulating layer is formed on the first insulating layer and also on the polysilicon wiring layer. A first aluminum wiring layer is formed on the second insulating layer, and a third insulating layer is formed on the first aluminum wiring layer. A via contact hole is then cut in the third insulating layer, vertically aligned with the polysilicon wiring layer. A second aluminum wiring layer is formed on the third insulating layer. Aluminum fills up the hole, whereby the second aluminum wiring layer is connected to the first aluminum layer.

An LSI of the second type is manufactured in the following method. A diffusion wiring layer is formed in a major surface of a semiconductor substrate. A first insulating layer is formed on this layer. A second insulating layer is formed on the first insulating layer. A first aluminum wiring layer is formed on the second insulating layer. A third insulating layer is formed on the first aluminum wiring layer. A via contact hole is then made in the third insulating layer, vertically aligned with the diffusion wiring layer. A second aluminum wiring layer is formed on the second insulating layer. Aluminum fills up the hole, whereby the second aluminum wiring layer is connected to the first aluminum layer.

In the LSI of the first type, the polysilicon wiring layer is formed on a portion of the first insulating layer, not on the entire surface thereof. All layers formed above polysilicon wiring layer are inevitably curved. In the LSI of the second type, the diffusion wiring layer is formed in the same step as sn element region (e.g., the source and drain regions of a MOS transistor), that portion of the first insulating layer which is formed on the diffusion wiring layer is thinner than the other portions. Hence, all layers formed above the first insulating layer are curved.

Here arises a problem with both LSIs when the via contact hole is made in the third insulating layer by applying a light beam to a photoresist layer formed on the third insulating layer. The beam is irregularly reflected when applied on the curving portion of the photoresist layer. This irregular reflection makes it impossible to cut a hole of an arcuate diameter at the desired position. In other words, misalignment of the via contact hole with the polysilicon wiring layer or the diffusion wiring layer occurs. Consequently, the second aluminum layer is short-circuited to the substrate. This causes an incomplete connection between the first and second aluminum wiring layers.

SUMMARY OF THE INVENTION

It is, therefore, an object of the present invention to provide a semiconductor integrated circuit (IC) device made by the polycell technique and having a via contact hole of accurate size and position to increase the packing density of the device.

According to the invention, there is provided a semiconductor IC device made by the polycell technique. This device comprises: a semiconductor substrate; various functional circuits formed in one major surface of the semiconductor substrate; a plurality of cell arrays each constituted by unit cells having the functional circuits; a wiring region formed between any two adjacent cell arrays; a first insulating layer formed on the semiconductor substrate; a polysilicon wiring layer formed on the first insulating layer, embedded in the corresponding unit cell, positioned in the wiring region and connected at one end to one of the input terminals of the corresponding unit cell; a second insulating layer formed on the first insulating layer and the polysilicon wiring layers; a first aluminum wiring layer formed on that portion of the second insulating layer which is positioned in the wiring region; a third insulating layer formed on the first aluminum wiring layer and the second insulating layer and having a via contact hole vertically aligned with the polysilicon wiring layer; a second aluminum wiring layer formed on that portion of the third insulating layer which is positioned in the wiring region, extending at right angles to the first aluminum wiring layer, connected to one of the output terminals of the unit cell and filling up the via contact hole, thus being connected to the first aluminum wiring layer; and a contact hole for connecting the first aluminum wiring layer to the polysilicon wiring layer.

With the above structure, the via contact hole of accurate size and shape can be formed at an accurate position, thereby providing a semiconductor integrated circuit device having a high packing density in accordance with the polycell technique.

DETAILED DESCRIPTION OF THE PREFERRED EMBODIMENTS

Figure 1:
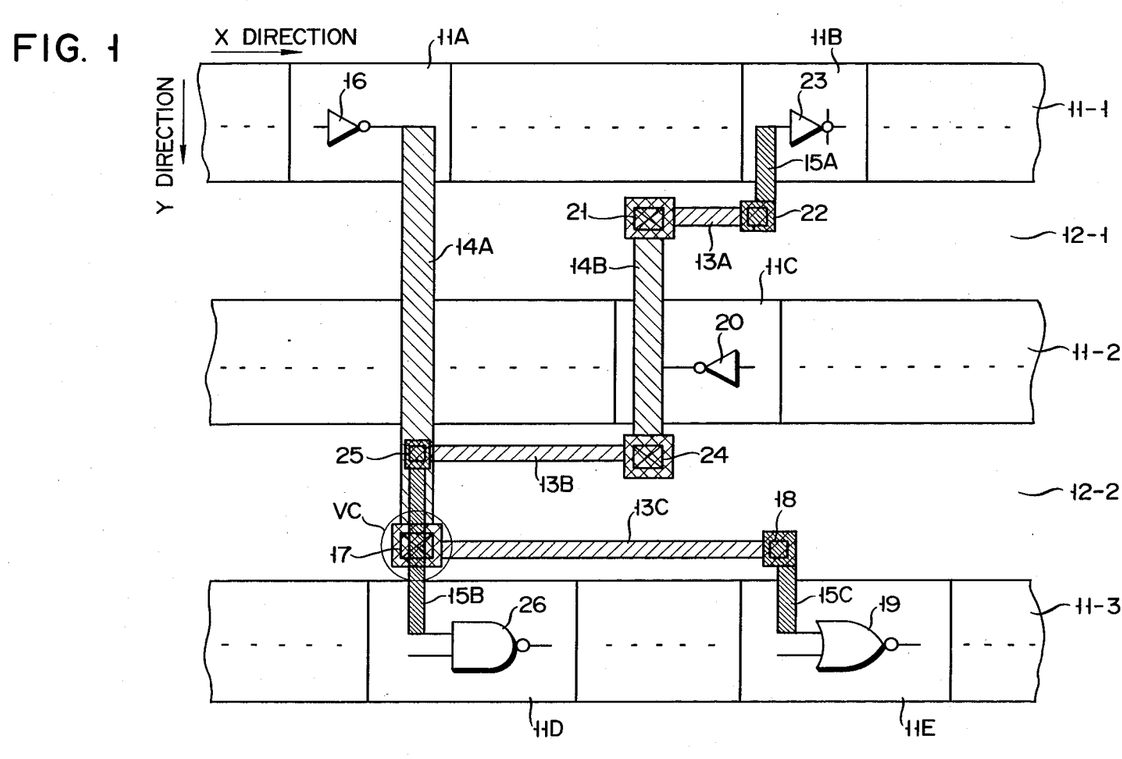
FIG. 1 is for explaining a semiconductor integrated circuit device formed by using a polycell technique according to an embodiment of the present invention.

FIG. 1 illustrates a plan-view pattern of a semiconductor integrated circuit device configured by using a polycell technique according to an embodiment of the present invention. Wiring regions (channel regions) 12-1, 12-2, . . . are formed between cell arrays 11-1 and 11-2, between cell arrays 11-2 and 11-3, . . . , respectively. Each of the arrays 11-1, 11-2, 11-3, . . . consists of unit cells (logic circuit blocks) 11A, 11B, 11C, . . . each including a predetermined functional circuit. Interconnection between the cells 11A, 11B, 11C, . . . are performed through the regions 12-1, 12-2, . . . by a desired circuit arrangement in accordance with an automatic design wiring technique using a computer. During this operation, first metal (aluminum) wiring layers 13A, 13B and 13C extend along a direction (X direction) parallel to the arrays 11-1, 11-2, 11-3, . . . , and second metal (aluminum) wiring layers 14A and 14B extend along a direction (Y direction) perpendicular to the arrays 11-1, 11-2, 11-3, . . . . The first aluminum wiring layers are used as power source lines for supplying a power source voltage to each unit cell, but connections therefor are omitted in FIG. 1. The second aluminum wiring layers are used as through wiring lines crossing over the cell arrays. Input signal lines connected to the cells 11B, 11D and 11E comprise polysilicon wiring layers 15A, 15B and 15C, respectively. The layers 15A, 15B and 15C are formed on a semiconductor substrate through an insulating layer. The layers 13A, 13B and 13C are formed on the layers 15A, 15B and 15C through an insulating layer. The layers 14A and 14B are formed on layers 13A, 13B and 13C through an insulating layer.

The structure of the semiconductor integrated circuit device of this embodiment will be described in more detail with reference to FIG. 1. The output terminal of an inverter 16 constituting the cell 11A is connected to one end of the layer 14A through a contact hole (not shown). The layer 14A passes above the array 11-2, and the other end of the layer 14A is connected to one end of the layer 13C through a via contact hole 17. The layer 15B is formed under the hole 17 through an insulating layer (this structure will be described in detail later). The other end of the layer 13C is connected to one end of the layer 15C through a contact hole 18. The other end of the layer 15C is connected to one input terminal of a NOR gate 19 constituting the cell 11E. Therefore, an output from the inverter 16 is supplied to one input terminal of the NOR gate 19 through the layers 14A, 13C and 15C.

The output terminal of an inverter 20 constituting the cell 11C is connected to the layer 14B through a contact hole (not shown). On end of the layer 14B is connected to one end of the layer 13A through a contact hole 21. The other end of the layer 13A is connected to one end of the layer 15A through a contact hole 22. The other end of the layer 15A is connected to the input terminal of a clocked inverter 23 constituting the cell 11B. The other end of the layer 14B is connected to one end of the layer 13B through a contact hole 24. The other end of the layer 13B is connected to one end of the layer 15B through a contact hole 25 formed under the layer 14A through an insulating layer. The layer 15B passes under the hole 17 (i.e., through an insulating layer), and the other end of the layer 15B is connected to one input terminal of a NAND gate 26 constituting the cell 11D. Therefore, an output from the inverter 20 is supplied to the input terminal of the inverter 23 through the layers 14B, 13A and 15A and to one input terminal of the NAND gate 26 through the layers 14B, 13B and 15B.

Figure 2A:
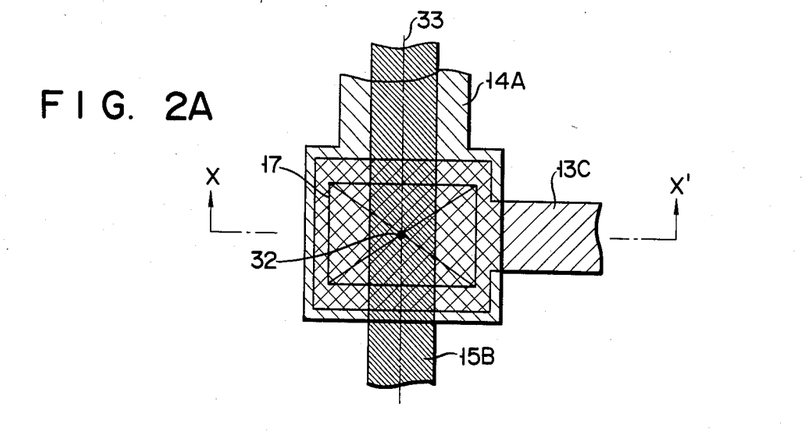
FIG. 2A is an enlarged plan view of a via contact hole portion of FIG. 1.
Figure 2B:
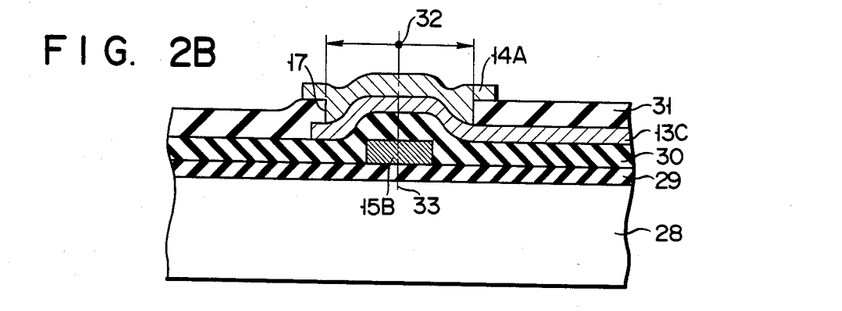
FIG. 2B is a sectional view of the via contact hole portion, taken along the line X—X' of FIG. 2A.

FIG. 2A is an enlarged plan view showing a pattern of a via contact hole portion VC of FIG. 1, and FIG. 2B is a sectional view thereof taken along the line X—X' of FIG. 2A. The same reference numerals as in FIG. 1 denote the same parts as in FIGS. 2A and 2B. A silicon oxide film 29 is formed on a silicon substrate (semiconductor substrate) 28. The layer 15B is formed on the film 29. A first CVD-SiO$_2$ film 30 is deposited on the layer 15B and the film 29. The layer 13C is formed on the film 30. A second CVD-SiO$_2$ film 31 is deposited on the layer 13C and the film 30. A via contact hole 17 is formed in the film 31. A center 32 of the hole 17 is aligned with a central line 33 of the layer 15B. The wiring layer 14A is formed on parts of the layer 13C and the film 31.

Figure 3:
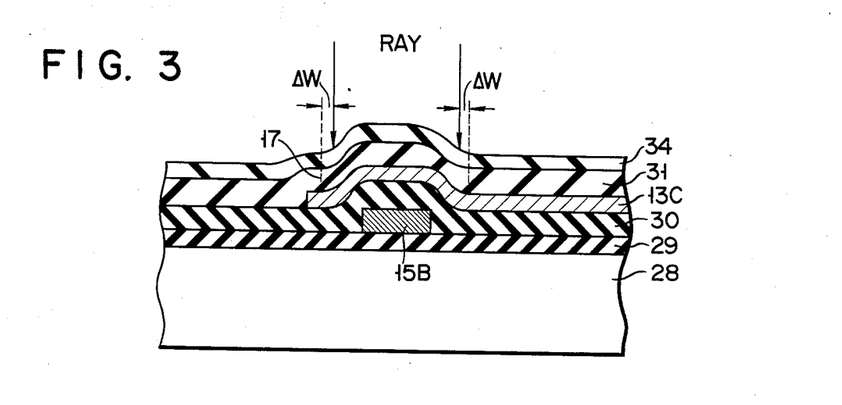
FIG. 3 is a sectional view, explaining an exposure process being performed during formation of the via contact hole of FIGS. 2A and 2B.

According to the pattern of the via contact hole shown in FIGS. 2A and 2B, errors (size, profile and positional errors) during the exposure process for forming the hole 17 can be minimized, as shown in FIG. 3. More specifically, a photoresist 34 is applied to the upper surface of the film 31 and is exposed with light. In this case, since the center 32 of the hole 17 is aligned with the line 33 of the layer 15B, lateral diffused reflection can be minimized. Only small errors $\Delta W$ occur at end portions, respectively. Therefore, the via contact hole portion between the layers 13C and 14A need not be excessively large in consideration of errors. In order to prevent formation of the hole 17 on the layer 15B, the hole 17 need not be formed on the film 30 between the polysilicon wiring layers, thereby greatly increasing the packing density.

Figure 4A:
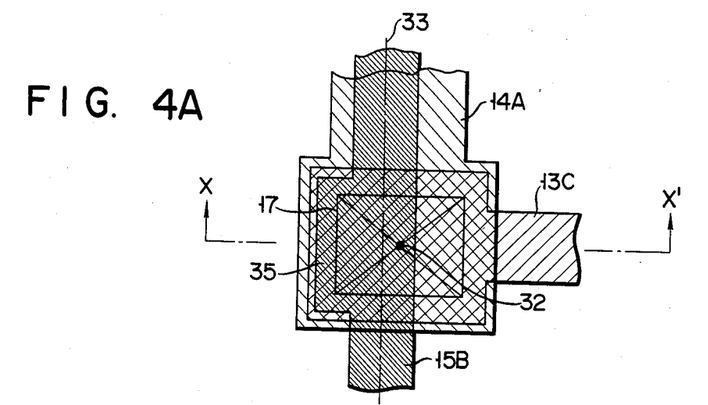
FIG. 4A is an enlarged plan view of another via contact hole portion.
Figure 4B:
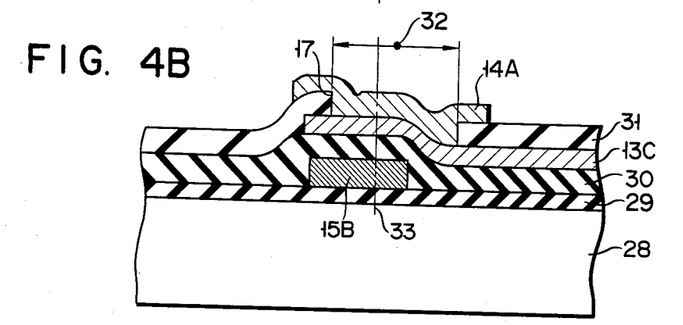
FIG. 4B is a sectional view of the portion, taken along the line X—X' of FIG. 4A.

FIG. 4A is an enlarged plan view showing another pattern of the via contact hole portion VC of FIG. 1, and FIG. 4B is a sectional view thereof taken along the line X—X' of FIG. 4A. The same reference numerals as in FIGS. 2A and 2B denote the same parts as in FIGS. 4A and 4B, and a detailed description thereof will be omitted. A via contact hole portion VC in FIGS. 4A and 4B is adapted when a central line 33 of a polysilicon wiring layer 15B is designed not to be aligned with a center 32 of a via contact hole 17. In particular, the center 32 of the hole 17 is deviated to the right of the line 33 of the layer 15B. With this structure, a width of the via contact hole portion VC in the layer 15B is constituted by a wide region 35 around (the right side) the hole 17.

Figure 5:
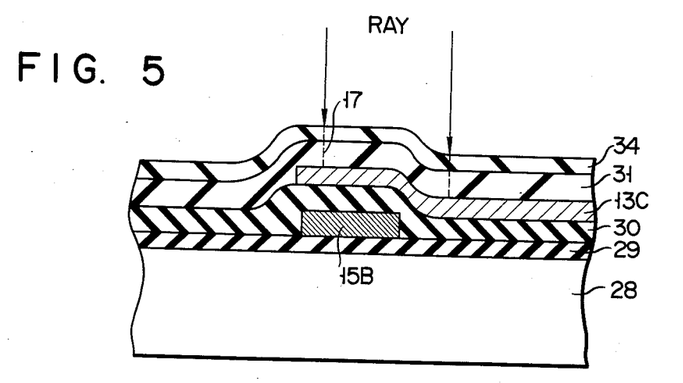
FIG. 5 is a sectional view explaining the exposure process for forming the via contact hole of FIGS. 4A and 4B.

Since the width of the layer 15B under the hole 17 is larger than those of other regions, a projection of a photoresist 34 under the edge of the hole 17 can be eliminated, as shown in FIG. 5. As a result, an amount of light reflected by the inclined surface of the photoresist 34 can be decreased, so that the hole 17 can be formed with a small error with respect to the design value. In this case, the region having a large width is restricted to only part of the layer 15B. Since a minimum value of the wiring layer width is generally given as (polysilicon layer)<(first aluminum wiring layer)<(second aluminum wiring layer), the pattern area will not increase (i.e., the first and scond aluminum wiring layers can be formed with a possible minimum width accomplished in a practical fabrication process). The packing density can be greatly increased as compared with the case wherein a via contact hole is formed between polysilicon wiring layers.

Figure 6A:
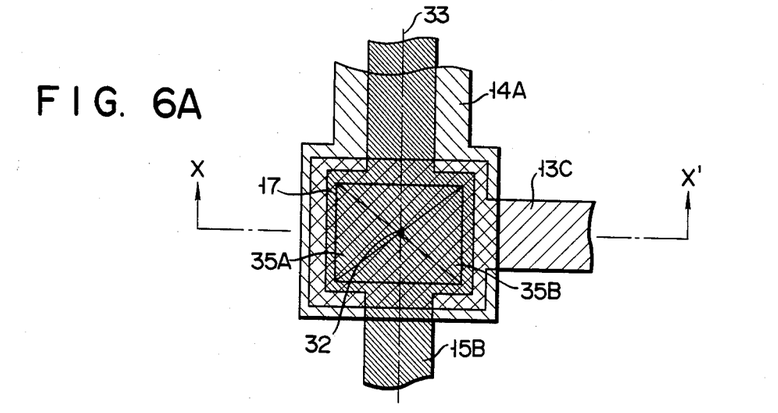
FIG. 6A is an enlarged plan view of still another via contact hole portion.
Figure 6B:
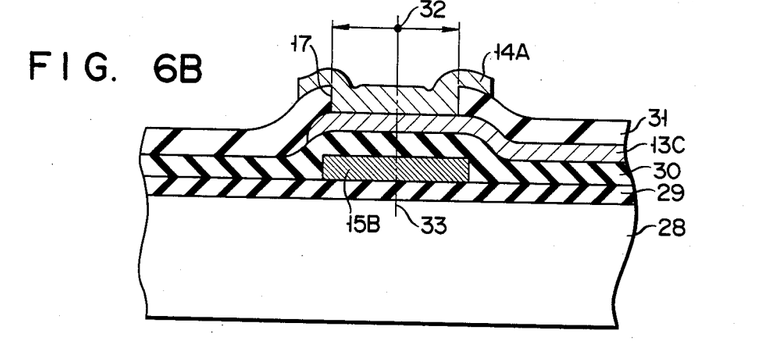
FIG. 6B is a sectional view of the via contact hole portion, taken along the line X—X' of FIG. 6A.

FIG. 6A is an enlarged plan view showing still another pattern of the via contact hole portion VC of FIG. 1, and FIG. 6B is a sectional view thereof taken along the line X—X' of FIG. 6A. A structure in FIGS. 6A and 6B is a combination of the structures of FIGS. 2A and 2B and FIGS. 4A and 4B. More specifically, a center 32 of a via contact hole 17 is aligned with a central line 33 of a polysilicon wiring layer 15B, and at the same time, wide regions 35A and 35B are formed to increase a wiring width of the layer 15B near the contact 17. The regions 35A and 35B are formed along the edge of the hole 17 and has a width smaller than that of a first aluminum wiring layer 13C.

Figure 7:
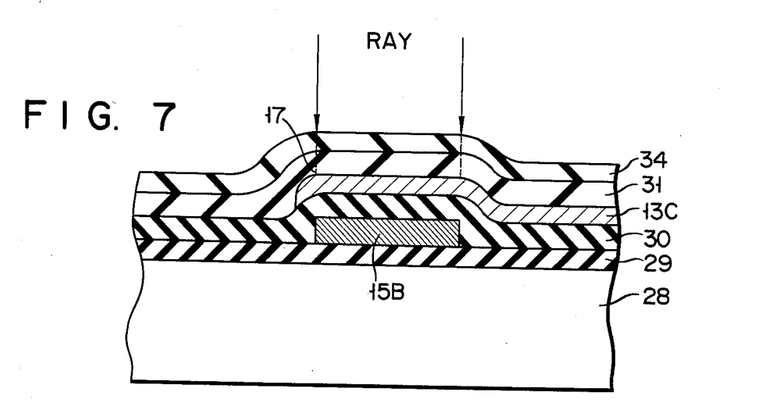
FIG. 7 is a sectional view explaining the exposure process for forming the via contact hole of FIGS. 6A and 6B.

With the above structure, during exposure of the photoresist 34, a prospective via contact hole 17 region of the photoresist 34 can be flattened, as shown in FIG. 7. Therefore, the hole 17 can be formed with a small error deviated from the design value, and hence the packing density can be increased in the same manner as in FIGS. 2A and 2B and FIGS. 4A and 4B.

Figure 8A:
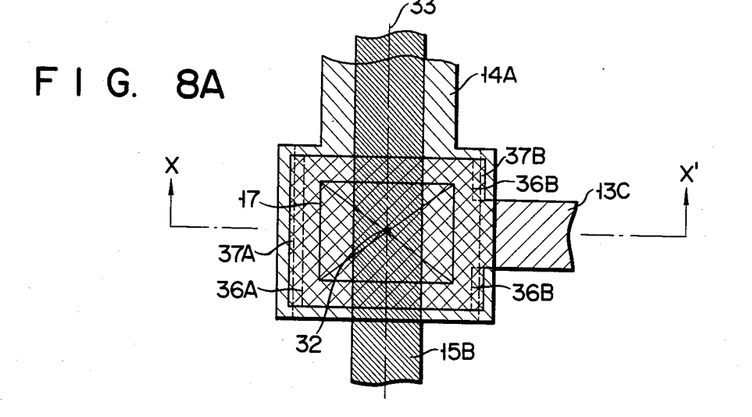
FIG. 8A is an enlarged plan view of still another via contact hole portion.
Figure 8B:
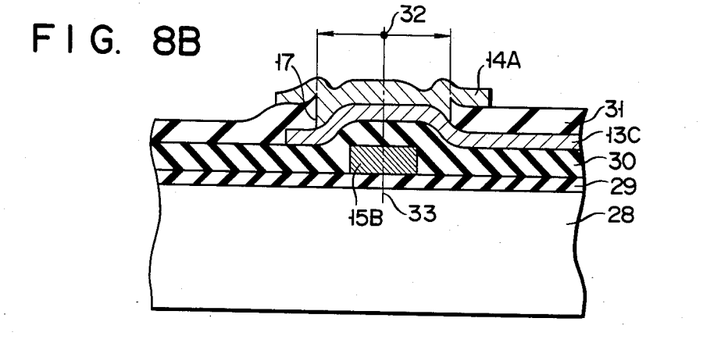
FIG. 8B is a sectional view of the via contact hole, taken along the line X—X' of FIG. 8A.

FIG. 8A is an enlarged plan view showing still another pattern of the via contact hole portion VC of FIG. 1, and FIG. 8B is a sectional view thereof taken along the line X—X' of FIG. 8A. Referring to FIGS. 8A and 8B, a center 32 of a via contact hole 17 is aligned with a central line 33 of a polysilicon wiring layer 15B. At the same time, a pattern around the hole 17 in first and second aluminum wiring layers 13C and 14A is elongated along a diameter perpendicular to the longitudinal direction of the layer 15B. Broken lines 36A and 36B and broken lines 37A and 37B represent initially given widths of the layers 13C and 14A around the hole 17, respectively. The pattern widths of the layers 13C and 14A around the hole 17 are given to be minimum as compared with the case wherein the center 32 of the hole 17 is not aligned with the line 33 of the layer 15B.

Figure 9:
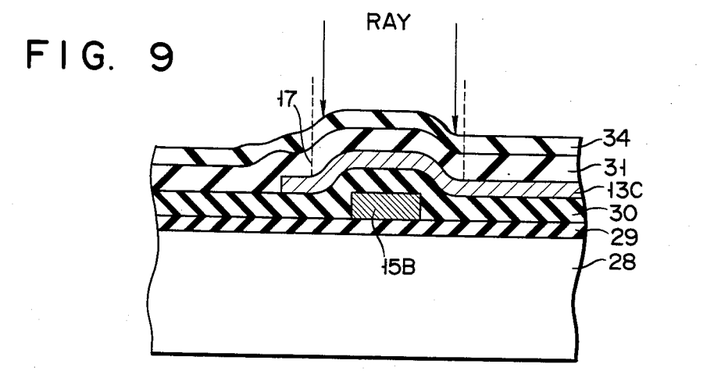
FIG. 9 is a sectional view explaining the exposure process for forming the via contact hole of FIGS. 8A and 8B.

With this structure, the hole 17 with a small error from the design value can be formed in the same manner as in the different portions VC described above, as shown in FIG. 9. The pattern widths of the layers 13C and 14A are increased around only the hole 17, and the width of other regions can be minimized to the limit imposed by the fabrication technique. As a result, the packing density of the semiconductor integrated circuit device is not decreased.

Figure 10A:
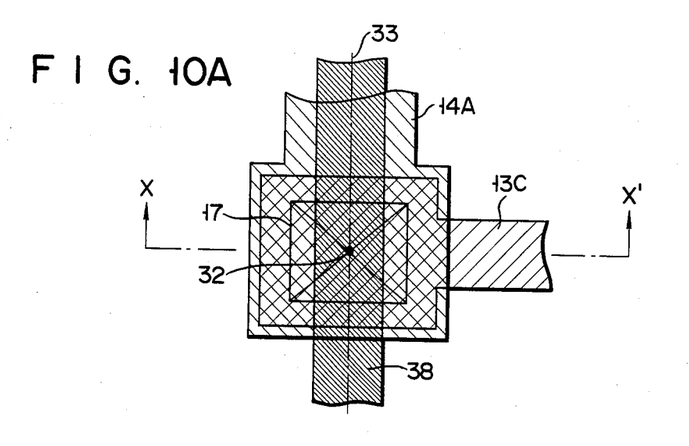
FIG. 10A is an enlarged plan view of still another via contact hole portion.
Figure 10B:
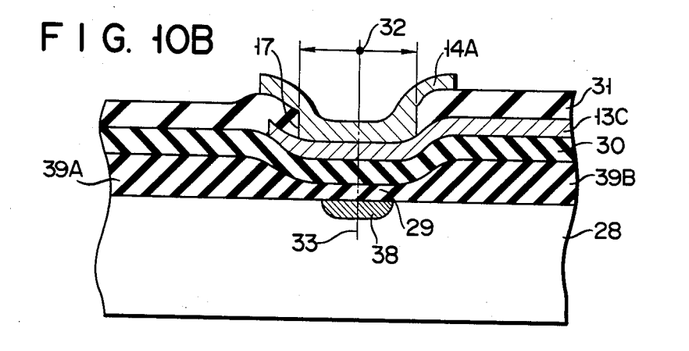
FIG. 10B is a sectional view of the via contact hole, taken along the line X—X' of FIG. 10A.

FIG. 10A is an enlarged plan view showing still another pattern of the via contact hole portion VC of FIG. 1, and FIG. 10B is a sectional view thereof taken along the line X—X' of FIG. 10A. FIGS. 10A and 10B show an arrangement of a via contact hole portion VC using a diffusion wiring layer as a lowest wiring layer. The layers 15A, 15B and 15C of FIG. 1 are replaced with the diffusion wiring layers. As shown in FIG. 10B, a diffusion wiring layer 38 is formed in one major surface of a silicon substrate 28. The layer 38 is formed simultaneously with functional circuit elements (e.g., source and drain regions of MOS transistors) in unit cells 11A, 11B, 11C, . . . . In practice, the layer 38 is formed by ion-implanting an impurity in the substrate 28 through a silicon oxide film 29 by using as masks field oxide films 39A and 39B formed on the substrate 28. A CVD-$SiO_2$ film 30 is deposited on the films 39A and 39B and the film 29. A first aluminum wiring layer 13C is formed on the film 30. A CVD-$SiO_2$ film 31 is deposited on the layer 13C and the film 30. A via contact hole 17 is formed in the film 31. A center 32 of the hole 17 is aligned with a central line 33 of the layer 38. A second aluminum wiring layer 14A is formed on parts of the layer 13C and the film 31 within the hole 17.

Figure 11:
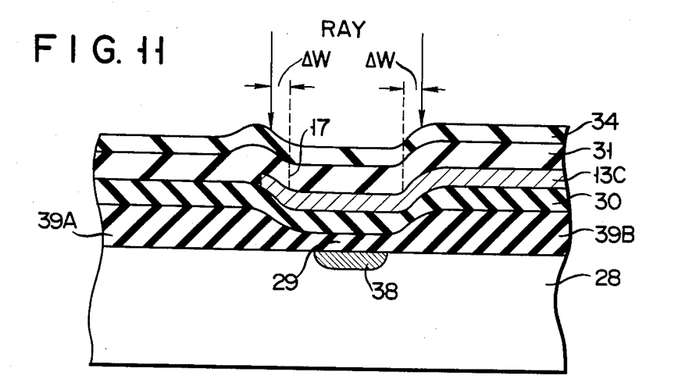
FIG. 11 is a sectional view explaining the exposure process for forming the via contact hole of FIGS. 10A and 10B.

Even if the lowest wiring layer comprises the diffusion layer as shown in FIGS. 10A and 10B, an error of the hole 17 can be minimized for the same reason as in FIGS. 2A and 2B, as shown in FIG. 11.

Figure 12:
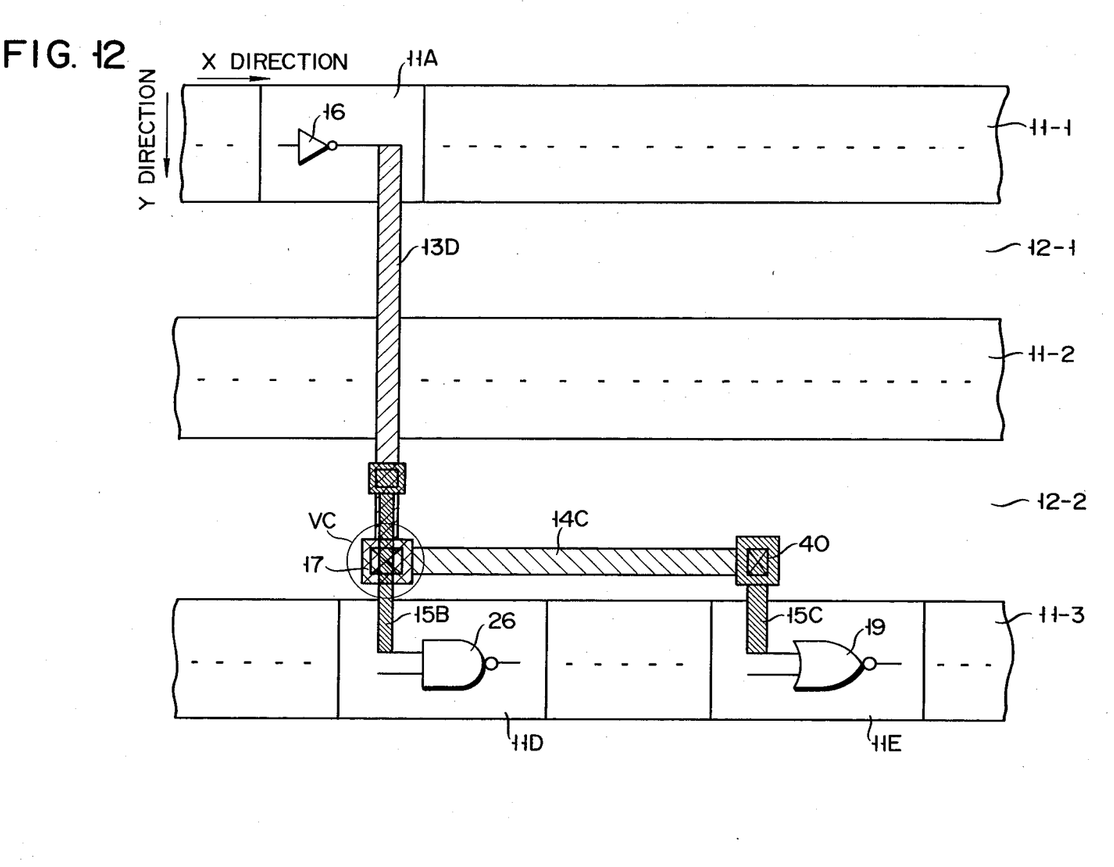
FIG. 12 is a plan view for explaining another semiconductor integrated circuit device of this invention made by using the polycell technique.

FIG. 12 shows a semiconductor integrated circuit device formed by the polycell technique according to another embodiment of the present invention. The device of FIG. 12 is substantially the same as that of FIG. 1 except that a first aluminum wiring layer 13D extends along the Y direction, and a second aluminum wiring layer 14C extends along the X direction. In other words, the difference between the devices of FIGS. 1 and 12 is only the wiring directions of the first and second aluminum wiring layers, and a detailed description thereof will be omitted.

When the first and second aluminum wiring layers are connected through the via contact hole 17 in the semiconductor integrated circuit device shown in FIG. 12, the structures shown in FIGS. 2A and 2B, FIGS. 4A and 4B, FIGS. 6A and 6B, FIGS. 8A and 8B and FIGS. 10A and 10B can be applied to obtain the same effects.

Referring to FIG. 12, when a second aluminum wiring layer 14C is connected to a polysilicon wiring layer 15C through a contact hole 40, they can be directly connected through a deep contact hole or they can be connected such that the layer 14C is connected to the first aluminum wiring layer which is connected to the polysilicon wiring layer 15C.

What is claimed is:

1. A semiconductor IC device made by the polycell technique, comprising:
    a semiconductor substrate;
    various functional circuits formed in one major surface of said semiconductor substrate;
    a plurality of cell arrays each constituted by unit cells having said functional circuits;
    a wiring region formed between any two adjacent cell arrays;
    a first insulating layer formed on said semiconductor substrate;
    a polysilicon wiring layer formed on said first insulating layer, embedded in the corresponding unit cell, positioned in said wiring region, extending at right angles to said cell arrays and connected at one end to one of the input terminals of the corresponding unit cell;

a second insulating layer formed on said first insulating layer and said polysilicon wiring layers;

a first metal wiring layer formed on that portion of said second insulating layer which is positioned in said wiring region;

a third insulating layer formed on said first metal wiring layer and said second insulating layer;

a second metal wiring layer formed on that portion of said third insulating layer which is positioned in said wiring region, and extending at right angles to said first metal wiring layer, part of said second metal wiring layer being selectively connected to one of the output terminals of said unit cell;

a via contact hole formed in said third insulating layer and positioned above said polysilicon wiring layer, for connecting said second metal wiring layer to said first metal wiring layer, said via contact hole having an axis aligned with that of said polysilicon wiring layer; and a contact hole formed in said second insulating layer, for connecting said first metal wiring layer to said polysilicon wiring layer.

2. A device according to claim 1, wherein said first and second metal wiring layers comprise aluminum layers formed by using the polycell technique, respectively.

3. A device according to claim 1, wherein said first metal wiring layer is formed parallel to said cell arrays, and said second metal wiring layer is formed perpendicular to said cell arrays.

4. A device according to claim 1, wherein said first metal wiring layer is formed perpendicular to said cell arrays, and said second metal wiring layer is formed parallel with said cell arrays.

5. A semiconductor IC device made by the polycell technique, comprising:

a semiconductor substrate;

various functional circuits formed in one major surface of said semiconductor substrate;

a plurality of cell arrays each constituted by unit cells having said functional circuits;

a wiring region formed between any two adjacent cell arrays;

a first insulating layer formed on said semiconductor substrate;

a polysilicon wiring layer formed on said first insulating layer embedded in the corresponding unit cell, positioned in said wiring region, extending at right angles to said cell arrays, and having two ends and a portion broader than the other portions, one of said ends being connected to one of the input terminals of the corresponding unit cell;

a second insulating layer formed on said first insulating layer and said polysilicon wiring layers;

a first metal wiring layer formed on that portion of said second insulating layer which is positioned in said wiring region;

a third insulating layer formed on said first metal wiring layer and said second insulating layer;

a second metal wiring layer formed on that portion of said third insulating layer which is positioned in said wiring region, and extending at right angles to said first metal wiring layer, part of said second metal wiring layer being selectively connected to one of the output terminals of said unit cell;

a via contact hole formed in said third insulating layer and positioned above the broader portion of said polysilicon wiring layer, for connecting said first metal wiring layer to said second metal wiring layer; and a contact hole formed in said second insulating layer, for connecting said first metal wiring layer to said polysilicon wiring layer.

6. A device according to claim 5, wherein said first and second metal wiring layers comprise aluminum layers formed by using the polycell technique, respectively.

7. A device according to claim 5, wherein said first metal wiring layer is formed parallel to said cell arrays, and said second metal wiring layer is formed perpendicular to said cell arrays.

8. A device according to claim 5, wherein said first metal wiring layer is formed perpendicular to said cell arrays, and said second metal wiring layer is formed parallel with said cell arrays.

9. A semiconductor IC device made by the polycell technique, comprising:

a semiconductor substrate;

various functional circuits formed in one major surface of said semiconductor substrate;

a plurality of cell arrays each constituted by unit cells having said functional circuits;

a wiring region formed between any two adjacent cell arrays;

a first insulating layer formed on said semiconductor substrate;

a polysilicon wiring layer formed on said first insulating layer, embedded in the corresponding unit cell, positioned in said wiring region, extending at right angles to said cell arrays, and having two ends, one of said ends being connected to one of the input terminals of the corresponding unit cell;

a first metal wiring layer formed on that portion of said second insulating layer which is positioned in the wiring region, and having a portion broader than the other portions;

a third insulating layer formed on said first metal wiring layer and said second insulating layer;

a second metal wiring layer formed on that portion of said third insulating layer which is positioned in the wiring region, extending at right angles to said first metal wiring layer, and having a portion broader than the other portions, part of said second metal wiring layer being selectively connected to one of the output terminals of said unit cell;

a via contact hole formed in said third insulating layer and above said polysilicon wiring layer in a position corresponding to the broader portions of said first and second metal wiring layers, for connecting said second metal wiring layer to said first metal wiring layer, said via contact hole having an axis aligned with that of said polysilicon wiring layer; and a contact hole formed in said second insulating layer, for connecting said first metal wiring layer to said polysilicon wiring layer.

10. A device according to claim 9, wherein said first and second metal wiring layers comprise aluminum layers formed by the polycell technique.

11. A device according to claim 9, wherein said first metal wiring layer is formed parallel to said cell arrays, and said second metal wiring layer is formed perpendicular to said cell arrays.

12. A device according to claim 9, wherein said first metal wiring layer is formed perpendicular to said cell arrays, and said second metal wiring layer is formed parallel with said cell arrays.

13. A semiconductor IC device made by the polycell technique, comprising:
a semiconductor substrate;
various functional circuits formed in one major surface of said semiconductor substrate;
a plurality of cell arrays each constituted by unit cells having said functional circuits;
a wiring region formed between any two adjacent cell arrays;
a diffusion wiring layer formed in one major surface region of said semiconductor substrate, embedded in the corresponding unit cell, positioned in said wiring region, extending at right angles to said cell arrays and connected at one end to one of the input terminals of the corresponding unit cell;
a first insulating layer formed on said semiconductor substrate, that portion of said first insulating layer which contacts said diffusion wiring layer is thinner than the other portions;
a second insulating layer formed on said first insulating layer;
a first metal wiring layer formed on that portion of said second insulating layer which is positioned in said wiring region;
a third insulating layer formed on said first metal wiring layer and said second insulating layer;
a second metal wiring layer formed on that portion of said third insulating layer which is positioned in said wiring region, and extending at right angles to said first metal wiring layer, part of said second metal wiring layer being selectively connected to one of the output terminals of said unit cell;
a via contact hole formed in said third insulating layer and positioned above said diffusion wiring layer, for connecting said second metal wiring layer to said first metal wiring layer, said via contact hole having an axis aligned with that of said diffusion wiring layer; and
a contact hole formed in said second insulating layer, for connecting said first metal wiring layer to said diffusion wiring layer.

14. A device according to claim 13, wherein said first and second metal wiring layers comprise aluminum layers formed by the polycell technique.

15. A device according to claim 13, wherein said first metal wiring layer is formed parallel to said cell arrays, and said second metal wiring layer is formed perpendicular to said cell arrays.

16. A device according to claim 13, wherein said first metal wiring layer is formed perpendicular to said cell arrays, and said second metal wiring layer is formed parallel with said cell arrays.

17. A semiconductor IC device made by the polycell technique, comprising:
a semiconductor substrate;
various functional circuits formed in one major surface of said semiconductor substrate;
a plurality of cell arrays each constituted by unit cells having said functional circuits;
a wiring region formed between any two adjacent cell arrays;
a diffusion wiring layer formed in one major surface region of said semiconductor substrate, embedded in the corresponding unit cell, positioned in said wiring regiuon, extending at right angles to said cell arrays, and having two ends and a portion broader than the other portions, one of said ends being connected to one of the input terminals of the corresponding unit cell;
a first insulating layer formed on said semiconductor substrate, that portion of said first insulating layer which contacts said diffusion wiring layer is thinner than the other portions;
a second insulating layer formed on said first insulating layer;
a first metal wiring layer formed on that portion of said second insulating layer which is positioned in said wiring region;
a third insulating layer formed on said first metal wiring layer and said second insulating layer;
a second metal wiring layer formed on that portion of said third insulating layer which is positioned in said wiring region, and extending at right angles to said first metal wiring layer, part of said second metal wiring layer being selectively connected to one of the output terminals of said unit cell;
a via contact hole formed in said third insulating layer and positioned above the broader portion of said diffusion wiring layer, for connecting said first metal wiring layer to said second metal wiring layer; and
a contact hole firmed in said second insulating layers, for connecting said first metal wiring layer to said diffusion wiring layer.

18. A device according to claim 17, wherein said first and second metal wiring layers comprise aluminum layers formed by using the polycell technique, respectively.

19. A device according to claim 17, wherein said first metal wiring layer is formed parallel to said cell arrays, and said second metal wiring layer is formed perpendicular to said cell arrays.

20. A device according to claim 17, wherein said first metal wiring layer is formed perpendicular to said cell arrays, and said second metal wiring layer is formed parallel with said cell arrays.

21. A semiconductor IC device made by the polycell technique, comprising:
a semiconductor substrate;
various functional circuits formed in one major surface of said semiconductor substrate;
a plurality of cell arrays each constituted by unit cells having said functional circuits;
a wiring region formed between any two adjacent cell arrays;
a diffusion wiring layer formed in one major surface region of said semiconductor substrate, embedded in the corresponding unit cell, positioned in said wiring region, extending at right angles to said cell arrays, and having two ends, one of said ends being connected to one of the input terminals of the corresponding unit cell;
a first insulating layer formed on said semiconductor substrate, that portion of said first insulating layer which contacts said diffusion wiring layer is thinner than the other portions;
a second insulating layer formed on said first insulating layer;
a first metal wiring layer formed on that portion of said second insulating layer which is positioned in the wiring region, and having a portion broader than the other portions;

a third insulating layer formed on said first metal wiring layer and said second insulating layer;

a second metal wiring layer formed on that portion of said third insulating layer which is positioned in the wiring region, extending at right angles to said first metal wiring layer, and having a portion broader than the other portions, part of said second metal wiring layer being selectively connected to one of the output terminals of said unit cell;

a via contact hole formed in said third insulating layer and above said diffusion wiring layer in a position corresponding to the broader portions of said first and second metal wiring layers, for connecting said second metal wiring layer to said first metal wiring layer, said via contact hole having an axis aligned with that of said diffusion wiring layer; and a contact hole formed in said second insulating layer, for connecting said first metal wiring layer to said diffusion wiring layer.

22. A device according to claim 21, wherein said first and second metal wiring layers comprise aluminum layers formed by the polycell technique.

23. A device according to claim 21, wherein said first metal wiring layer is formed parallel to said cell arrays, and said second metal wiring layer is formed perpendicular to said cell arrays.

24. A device according to claim 21, wherein said first metal wiring layer is formed perpendicular to said cell arrays, and said second metal wiring layer is formed parallel with said cell arrays.

* * * * *